United States Patent [19]

Tazaki et al.

[11] 4,209,850
[45] Jun. 24, 1980

[54] ELECTRONIC APPARATUS

[75] Inventors: Shigemitsu Tazaki, Matsudo; Akihiro Yamataka, Funabashi; Tsunenori Souma; Tadao Kusumoto, both of Tokyo, all of Japan

[73] Assignee: Canon Kabushiki Kaisha, Tokyo, Japan

[21] Appl. No.: 945,118

[22] Filed: Sep. 25, 1978

[30] Foreign Application Priority Data

Sep. 30, 1977 [JP] Japan ............................... 52-118229

[51] Int. Cl.² ........................................... G11C 13/00
[52] U.S. Cl. .................................... 365/189; 360/15; 365/229
[58] Field of Search ................. 365/94, 229, 189; 360/15

[56] References Cited

U.S. PATENT DOCUMENTS

| 3,436,734 | 1/1969 | Pomerene | 365/200 |
| 4,051,461 | 9/1977 | Hashimoto et al. | 365/200 |
| 4,066,880 | 1/1978 | Salley | 365/200 |

Primary Examiner—Terrell W. Fears
Attorney, Agent, or Firm—Fitzpatrick, Cella, Harper & Scinto

[57] ABSTRACT

A digital electronic apparatus is provided for allowing easy copying from a first memnory to a second memory. Said copying operation can be arbitrarily controlled from a key entry means. Said first and second memories are constructed in the form of a pack detachable from said electronic apparatus. The copying operation cannot be easily performed by an unauthorized person as the information including the copying instruction is contained in a pack.

8 Claims, 3 Drawing Figures

ELECTRONIC APPARATUS

BACKGROUND OF THE INVENTION

1. Field of the Invention

The present invention relates to a digital electronic apparatus, and more particularly to an electronic apparatus allowing for ready copying of the content of a first memory to a second memory.

2. Description of the Prior Art

For example, for small electronic calculators, there has been proposed a memory pack system for increasing the performance thereof. Such memory packs are exclusively prepared for calculations of financial figures, statistics or deviations, and each calculator is usually provided with only one pack.

Thus, where a calculator is used simultaneously with another calculator for the same purpose, it becomes necessary to copy the content of a memory pack to an another pack. However, there has not been available an apparatus capable of easily performing such memory copying operation. Moreover, it is undesirable from the standpoint of security if said copying operation is achievable by any person.

SUMMARY OF THE INVENTION

The object of the present invention is to prevent the above-mentioned drawbacks.

Another object of the present invention is to allow easy control of the copying operation from a key entry means.

A still further object of the present invention is to provide a structure wherein the copying instruction is stored in the form of a pack to prevent copying by an unauthorized person.

DESCRIPTION OF THE PREFERRED EMBODIMENTS

Figure 1:
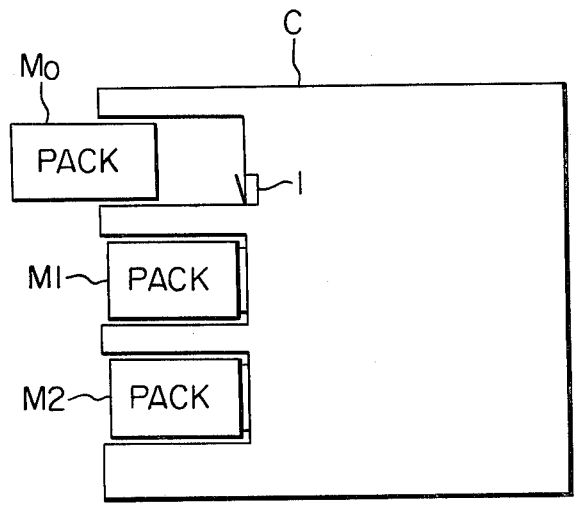
FIG. 1 is a plan view of an electronic apparatus embodying the present invention.

As shown in FIG. 1, there is provided a pack M0 with a copy instruction stored therein and which is attached to the calculator to copy all or a part of the content of a pack M1 into another pack M2. More specifically, the pack M0 stores a sequence for transferring the content of the pack M1 to the pack M2 and a sequence for accepting a key entry, the data transfer being controlled by said sequences. The pack M1 is a memory storing a content to be copied, and the pack M2 is a memory for copying.

The calculator is provided with a switch 1 in a recess for receiving said pack M0, said switch 1 being adapted to be closed when said pack M0 is mounted.

Figure 2:
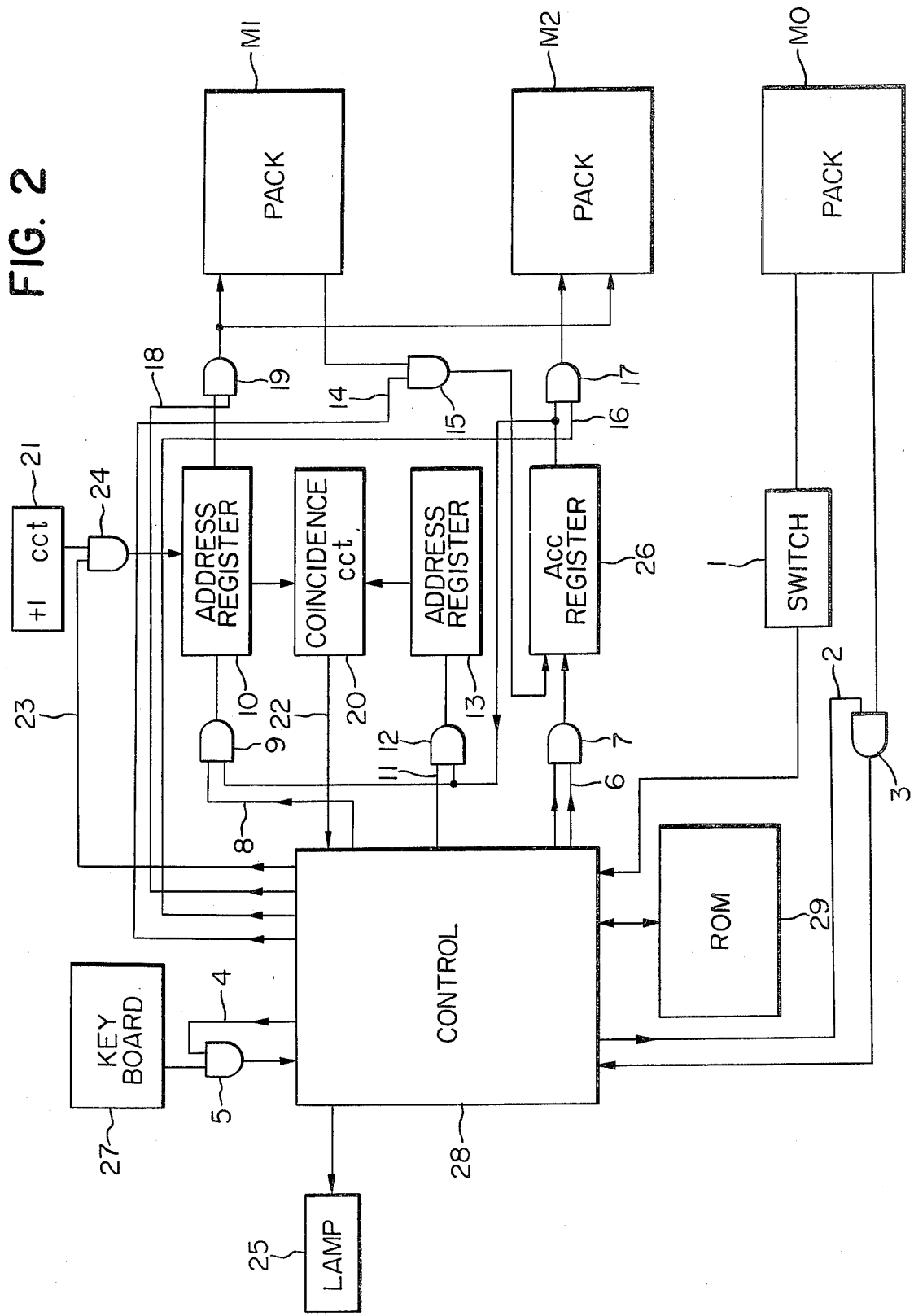
FIG. 2 is a block diagram thereof.

Now referring to FIG. 2, upon mounting of the pack M0, the switch 1 is closed and a sequence stored in a read-only memory (ROM) 29 causes a control unit 28 to generate a logic 1 signal to a signal circuit 2, whereby a gate 3 is opened and the control unit is switched, under control by the ROM 29, to the sequence control to the pack M0.

Upon said switching, a signal circuit 4 releases a logic 1 signal to open a gate 5, thereby awaiting an entry from a keyboard 27.

In case of a partial copying, a part of the content of pack M1 the address of which is designated by key entry, is transferred to the pack M2, whereas in case of an entire copying, the entire content of the pack M1 is transferred to the pack M2 by a start key entry.

Now there will be explained the method of key entry of memory address and start key.

The memory addresses in a calculator are generally represented by hexadecimal numbers, in which 10 to 15 in decimal numbers are respectively represented by A, B, C, D, E and F for example so that the numbers O to F in hexadecimal numbers correspond to 0000 to 1111 in a binary system. Thus the addresses OO to FF, for example, correspond to the addresses 0 to 255 in the decimal system.

In order to indicate the address directly from the keyboard to the memory, therefore, it becomes necessary to have keys indicating the numbers A to F in addition to ten ordinary keys.

In the present embodiment, when the calculator is switched to the control by the pack M0 upon mounting thereof, the sequence for accepting key entry causes the function keys to represent said numbers A to F in addition to the ten keys (said key hereinafter collectively called address keys).

Figure 3:
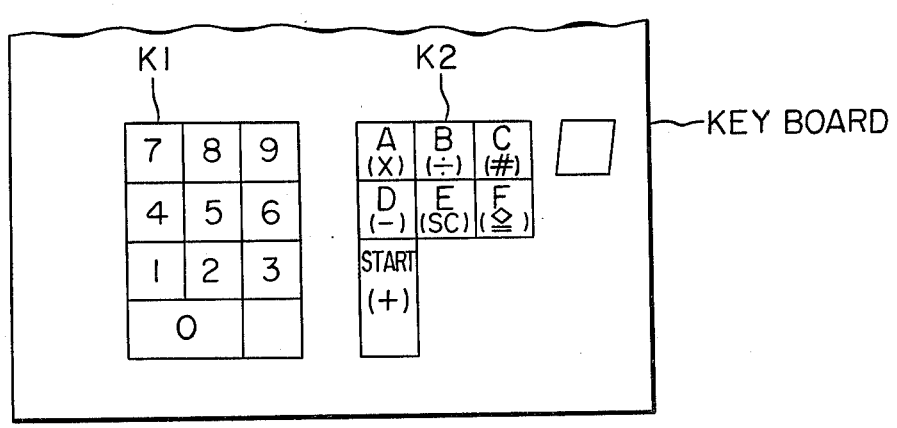
FIG. 3 is a partial detailed view of a key entry means.

More specifically, as shown in FIG. 3, the function keys "×", "÷", "#", "−", "SC" and "◇" respectively represent A, B, C, D, E and F in this case. Similarly the "+" key also represents the start key entry.

The address key inputs are stored, through a gate 7 opened by a logic 1 signal supplied through a signal line 6, successively into an accumulator register 26. Upon successive entry of start key input, the signal on said line 6 is changed to level 0 to close the gate 7 thereby latching the content of said register 7, and a logic 1 signal is supplied to a signal line 8 to open a gate 9 thereby transferring the content of said register 26, as a copy start address, to an address register 10. Upon completion of transfer, the signal on said line 9 is changed to logic 0 level thereby closing the gate 9. Successively there is repeated the above-explained procedure, and, upon start key input a logic 1 signal is supplied to a signal line 11 to open a gate 12 thereby transferring the content of accumulator register 26, as a copy end address, to an address register 13. Upon completion of the transfer, the signal on said line 11 is changed to level 0 to close the gate 12. Successively a logic 1 signal is supplied to a signal line 18 to open a gate 19 thereby designating the memory addresses in the packs M1 and M2 according to the content of register 10, and a logic 1 signal is supplied to a signal line 14 to open a gate 15 thereby transferring the data of memory to the accumulator register 26. During said transfer the signal line 16 is maintained at logic 0 level to close the gate 17. Upon completion of said transfer, a logic 1 signal is supplied to said signal line 16 to open the gate 17 thereby storing the content of said register 26 into the memory. During said storing the signal line 14 is maintained at logic 0 level to close the gate 15. The address in this state remains same as previously instructed.

Upon completion of said storing operation, the contents of the address registers 10 and 13 are compared in a coincidence circuit 20, which releases, in case of mutual coincidence, a logic 1 signal through a signal line 22 to the control unit 28 to allow detection of completion of copying between the designated addresses, whereby the control unit 28 is switched from the control by the pack M0 to the control by ROM 29 and indicates the completion of copying by a copy end lamp 25 or by a numeral display device.

In case of no coincidence, a logic 1 signal is supplied to a signal line 23 to open a gate 24 whereupon a step counter 21 adds one to the content of address register 10. Upon completion of said addition the signal line 23 is changed to logic 0 level to close the gate 24, and a logic 1 signal is supplied to the signal line 18 to open the gate 19 whereupon the above-explained procedure is repeated by designating the memory addresses in the packs M1 and M2 according to the thus step advanced content of the address register 10 thereby performing the transfer from the pack M1 to M2.

Also in case of transferring the entire content of the pack M1 to the pack M2, the instruction is distinguished by a first start key input in contrast to the first address key input in case of a partial copying explained in the foregoing, and said first start key entry stores a number "0" into the address register 10 and a number corresponding to the entire pack to the address register 13 whereby the copying is completed by the repetition of the above-explained procedure.

What is claimed is:

1. An electronic apparatus comprising:
   key input means for indicating a copying range;
   a main body of the electronic apparatus connected to said key input means;
   a first memory pack detachably connected to said main body of electronic apparatus;
   a second memory pack detachably connected to said main body of electronic apparatus; and
   copying means for transferring all or a part of the content of said first memory pack to said second memory pack according to a control of the copying range by said key input means.

2. An electronic apparatus according to the claim 1, wherein said copying means comprises a third memory pack detachably connected to said main body of said electronic apparatus.

3. An electronic apparatus according to the claim 1, further comprising indicating means for indicating the completion of said copying.

4. An electronic apparatus according to the claim 1 wherein said key input means comprises keys each representing plural meanings.

5. An electronic apparatus according to the claim 1 wherein said electronic apparatus comprises a small calculator.

6. An electronic apparatus comprising:
   a main body of the electronic apparatus;
   a first memory provided in said main body of the electronic apparatus;
   a second memory provided in said main body of the electronic apparatus;
   a copying pack detachably connected to said main body of the electronic apparatus and storing therein an instruction for copying all or a part of the content stored in said first memory; and
   indicating means for indicating the completion of said copying.

7. An electronic apparatus according to the claim 6 wherein at least said first memory is detachably connected to the main body of said electronic apparatus.

8. An electronic apparatus according to the claim 6 wherein said electronic apparatus comprises a small calculator.

* * * * *